US012674249B2

(12) United States Patent
Shinya et al.

(10) Patent No.: US 12,674,249 B2
(45) Date of Patent: *Jul. 7, 2026

(54) METHOD FOR PRODUCING SIC SINGLE CRYSTAL

(71) Applicant: Shin-Etsu Chemical Co., Ltd., Tokyo (JP)

(72) Inventors: Naofumi Shinya, Echizen (JP); Norio Yamagata, Echizen (JP); Yu Hamaguchi, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 60 days.

This patent is subject to a terminal disclaimer.

(21) Appl. No.: 17/879,218

(22) Filed: Aug. 2, 2022

(65) Prior Publication Data

US 2023/0042620 A1     Feb. 9, 2023

(30) Foreign Application Priority Data

Aug. 5, 2021     (JP) ................................. 2021-128833
Jul. 22, 2022     (JP) ................................. 2022-116851

(51) Int. Cl.
*C30B 15/02*          (2006.01)
*C30B 29/36*          (2006.01)
(52) U.S. Cl.
CPC .............. *C30B 15/02* (2013.01); *C30B 29/36* (2013.01)
(58) Field of Classification Search
CPC ......... C30B 15/02; C30B 19/04; C30B 29/36; C30B 9/06; C30B 9/10
See application file for complete search history.

(56) References Cited

U.S. PATENT DOCUMENTS

2003/0054188 A1*  3/2003  Ishikawa ............. H01L 21/4871
                                                                        428/312.8
2012/0132132 A1     5/2012  Urakami et al.
(Continued)

FOREIGN PATENT DOCUMENTS

JP          2000264790 A        9/2000
JP          2001181066 A  *  7/2001  ........... C04B 35/565
(Continued)

OTHER PUBLICATIONS

State-of-the-Art SiC Power Device Technology, Chapter 4, Section 1, 1.2: "SiC Solution growth method," May 14, 2010, pp. 41-43, S&T Publishing, Inc., with English translation, cited in Specification (8 pages).

(Continued)

*Primary Examiner* — Hua Qi
(74) *Attorney, Agent, or Firm* — WHDA, LLP

(57)          ABSTRACT

In SiC single crystal production by the solution process, an alloy of silicon (Si) and a metallic element M that increases the solubility of carbon (C) is pre-impregnated into a SiC sintered body having a relative density of 50 to 90%, following which Si and M are placed in a SiC crucible made of the SiC sintered body and the Si and M within the SiC crucible are melted, forming a Si—C solution. With heating, SiC from the SiC sintered body dissolves into the Si—C solution, efficiently supplying Si and C to the Si—C solution. As a result, Si and C are supplied uniformly and in the proper amount from all areas of contact between the SiC crucible and the Si—C solution, enabling a high-quality SiC single crystal to be stably produced over a long time at a rapid growth rate.

8 Claims, 5 Drawing Sheets

(56)        References Cited

U.S. PATENT DOCUMENTS

| 2017/0067183 | A1 | 3/2017 | Seki et al. |
| 2018/0230623 | A1 | 8/2018 | Shinya et al. |
| 2018/0257993 | A1* | 9/2018 | Shinya .................... C30B 19/06 |

FOREIGN PATENT DOCUMENTS

| JP | 2004002173 | A | 1/2004 |
| JP | 2006143555 | A | 6/2006 |
| JP | 2015-110495 | A | 6/2015 |
| JP | 2015-110496 | A | 6/2015 |
| JP | 2015-110498 | A | 6/2015 |
| JP | 2015-110499 | A | 6/2015 |
| JP | 2015-110500 | A | 6/2015 |
| JP | 2015-110501 | A | 6/2015 |
| JP | 2017-31034 | A | 2/2017 |
| JP | 2017-31036 | A | 2/2017 |

OTHER PUBLICATIONS

Non-Final Office Action dated Mar. 12, 2024, issued in U.S. Appl. No. 17/939,152. (27 pages).
Sugiyama et al., "SiC Bulk Single Crystal Growth by Sublimation Method", Applied Physics, 2001, vol. 70, No. 5, pp. 569-570, with English translation. (4 pages).
Komatsu et al., "Low-TSD bulk growth by application of TSD conversion layer on solution-grown 4L$_<$ off-axis C-face to sublimation process" Application of TSD conversion layer by solution growth for reduction of TSDs in 4H—SiC bulk crystals, Proceedings of 5th Advanced Power Semiconductor Subcommittee, 2018, vol. 5, pp. 125-126, with English translation. (5 pages).

* cited by examiner

METHOD FOR PRODUCING SIC SINGLE CRYSTAL

CROSS-REFERENCE TO RELATED APPLICATION

This non-provisional application claims priority under 35 U.S.C. § 119(a) on Patent Application Nos. 2021-128833 and 2022-116851 filed in Japan on Aug. 5, 2021 and Jul. 22, 2022, respectively, the entire contents of which are hereby incorporated by reference.

TECHNICAL FIELD

The present invention relates to silicon carbide (SiC) crystal growth technology. More particularly, the invention relates to a method for producing SiC single crystals that enables a low-defect, high-quality SiC single crystal to be stably produced over a long time.

BACKGROUND ART

SiC is a wide-bandgap semiconductor material. With its excellent heat conductivity and chemical stability and given also its dielectric breakdown properties and transistor properties such as saturated drift velocity, SiC possesses basic physical characteristics that make it well-suited for use in power devices. For these and other reasons, there are high expectations for SiC as a next-generation power device material. Indeed, the commercialization of SiC power devices has already been reported.

However, SiC substrates are expensive compared with silicon substrates, in addition to which single-crystal substrates that are sufficiently low-defect and high-quality have yet to be achieved. The primary reason for the difficulty of producing low-defect, high-quality SiC single-crystal substrates is that SiC does not melt under atmospheric pressure. In the case of silicon, which is widely used in semiconductor device substrates, the melting point under atmospheric pressure is 1,414° C., and low-defect, high-quality large-diameter single crystals can be obtained from a silicon melt by the Czochralski (CZ) method or the float-zone (FZ) method.

By contrast, because SiC sublimates at a temperature of about 2,000° C. when heated under atmospheric pressure, SiC single crystals cannot be produced using crystal growing methods based on the CZ method or the FZ method. Hence, SiC single crystals today are produced chiefly by sublimation methods such as the modified Lely method. Sublimation methods are currently the only way to mass-produce SiC single crystals. Four inch-diameter SiC single-crystal substrates produced in this way are widely available commercially, and efforts to mass-produce 6 inch-diameter SiC single-crystal substrates have also been reported.

However, when a SiC single crystal obtained by a sublimation method is used to fabricate power devices, the device characteristics are not always adequate. This is because achieving low defects in a SiC single crystal is not easy. Crystal growth by sublimation is a process that involves deposition from a vapor phase. The growth rate is slow and, moreover, temperature control within the reaction space is difficult. In recent years, as a result of active improvements and refinements in the technology, the dislocation density of micropipe has decreased. However, lattice defects which affect the electrical properties of a device, such as threading screw dislocations, edge dislocations and basal plane dislocations, are still present in a high density within the single crystal.

SiC crystal growth methods based on the solution process have recently attracted attention (see, for example, JP-A 2000-264790, JP-A 2004-002173 and JP-A 2006-143555). In this approach, unlike the methods described above, SiC itself does not melt under atmospheric pressure. In SiC single crystal production by the solution process, a SiC single crystal is obtained by dissolving carbon in a silicon melt within a graphite crucible from a high-temperature region at the bottom of the crucible, bringing a SiC seed crystal into contact with this Si—C melt, or immersing a SiC seed crystal in this Si—C melt, and inducing epitaxial growth on the SiC seed crystal. In this type of solution process, because SiC crystal growth proceeds in a state very close to thermal equilibrium, compared with a SiC single crystal obtained by a sublimation process, a low-defect product can be obtained.

The solution process for obtaining a SiC single crystal encompasses a variety of techniques. In *State-of-the-Art SiC Power Device Technology*, Chapter 4, Section 1, 1.2: "SiC Solution growth method," pp 41-43 (published May 14, 2010, S&T Publishing, Inc.), these techniques are broadly divided into four types: the traveling solvent method (TSM), the slow cooling technique (SCT), the vapor liquid solid (VLS) method and the top-seeded solution growth (TSSG) method. In the present specification, unless noted otherwise, "the solution process" refers to the top-seeded solution growth (TSSG) method.

In a SiC single crystal production method based on the solution process, first a silicon melt is formed within a graphite crucible and carbon is dissolved in the melt to form a Si—C solution. Because carbon has a very low solubility of about 1 at % in the Si—C solution, transition metals and the like are commonly added to the Si—C solution to facilitate dissolution of the carbon, (see JP-A 2000-264790, JP-A 2004-002173 and JP-A 2006-143555). Elements added for this purpose reportedly include transition metal elements such as Ti, Cr, Ni and Fe, low-melting metallic elements such as Al, Sn and Ga, and also various rare-earth elements. The types and amounts of these added elements are decided while weighing a number of considerations, such as the promotion of carbon dissolution, the precipitation of SiC from the Si—C solution as the primary phase and good equilibrium of the remaining solution as a liquid phase, not having the added elements induce the precipitation of carbide and other phases, stable precipitation of the target polymorph from among the SiC crystal polymorphs, and achieving a solution composition that makes the single crystal growth rate as high as possible.

SiC single crystal growth based on prior-art solution processes is generally carried out by a procedure such as the following. First, a silicon starting material is placed in a crucible made of carbon or graphite and is heated and melted in an inert gas atmosphere.

The carbon component is supplied to the silicon melt from the crucible, forming a Si—C solution. In some cases, a carbon compound is placed in the crucible and melted together with the silicon starting material. After sufficient carbon component has thus dissolved in the Si—C solution, a SiC seed crystal is brought into contact with the Si—C solution and, utilizing a temperature gradient that has been formed in the overall solution, a single crystal is grown.

However, there are certain problems with such a prior-art solution process. One problem is that, as growth of the SiC single crystal proceeds, the silicon constituent steadily disappears from the Si—C solution and the solution composition gradually changes. When the solution composition changes during growth of the SiC single crystal, the SiC precipitation environment obviously changes. As a result, stably continuing SiC single crystal growth for a long time becomes difficult. A second problem is the excess melting and incorporation of carbon from the crucible. As SiC single crystal growth proceeds, the silicon ingredient steadily disappears from the Si—C solution; at the same time, carbon is continuously supplied from the crucible. A relative excess of carbon thus enters into the Si—C solution, as a result of which the Si/C compositional ratio of the Si—C solution ends up changing. A third problem is the precipitation of SiC polycrystals on crucible surfaces (especially the inside wall) in contact with the Si—C solution. As mentioned above, when excess carbon dissolves from the crucible into the Si—C solution, fine SiC polycrystals readily form on the inside wall of the crucible. Such SiC polycrystals float within the SiC solution and reach the vicinity of the solid-liquid interface between the SiC single crystal and the Si—C solution during crystal growth, interfering with single crystal growth.

SUMMARY OF THE INVENTION

It is therefore an object of this invention to provide a method which, by minimizing fluctuations in the composition of the Si—C solution and suppressing the formation of SiC polycrystals that precipitate onto interior surfaces of the crucible, is capable of producing a low-defect, high-quality SiC single crystal at a rapid growth rate compared with methods that use conventional graphite crucibles.

Prior-art solution processes use a crucible made of a heat-resistant carbon material, such as a graphite crucible. A Si—C solution is held in a carbon crucible and carbon within the solution is replenished by having carbon dissolve out from the carbon crucible.

However, as SiC crystal growth proceeds, a decrease in the compositional ratio of the silicon constituent within the Si—C solution is unavoidable.

Methods that use, in the solution process, SiC as the source for supplying silicon and carbon to a Si—C solution have hitherto been described in JP-A 2015-110495, JP-A 2015-110496, JP-A 2015-110498, JP-A 2015-110499, JP-A 2015-110500, JP-A 2015-110501, JP-A 2017-031034 and JP-A 2017-031036. To increase productivity, it is necessary to increase the growth rate by more efficiently dissolving SiC from a SiC crucible. The contact surface area between the Si—C solution and the SiC crucible is rate-determining on the amount of SiC dissolution from the SiC crucible, but this contact surface area is limited. Moreover, increasing the volume of the SiC solution lowers the contact surface area ratio relative to the capacity, as a result of which SiC dissolution becomes even more inadequate.

The inventors have discovered that by rendering an alloy of silicon and a metallic element M that increases the solubility of carbon into a melt and pre-impregnating the melt into a SiC sintered body having a relative density of 50 to 90% to form a SiC crucible and then placing silicon and the metallic element M in the SiC crucible, melting the silicon and the metallic element M within the SiC crucible to form a Si—C solution, dissolving in the Si—C solution, by heating of the SiC crucible, silicon and carbon originating in the SiC sintered body from surfaces of the SiC sintered body in contact with the Si—C solution, and moreover bringing a SiC seed crystal into contact with a top portion of the Si—C solution so as to grow a SiC single crystal on the SiC seed crystal, because the Si—C solution penetrates to the interior of the SiC sintered body and SiC efficiently dissolves in the Si—C solution, fluctuations in the composition of the Si—C solution are minimized and the formation of SiC polycrystals that precipitate on the inner surfaces of the crucible is suppressed, enabling a low-defect, high-quality SiC single crystal to be produced at a rapid growth rate compared with methods that use conventional graphite crucibles.

Accordingly, the invention provides a method for producing a SiC single crystal, which method includes the steps of:
  placing silicon and a metallic element M that increases the solubility of carbon in a SiC crucible formed of a SiC sintered body having a relative density of from 50 to 90%,
  melting the silicon and the metallic element M to form a Si—C solution,
  dissolving in the Si—C solution, by heating of the SiC crucible, silicon and carbon originating in the SiC making up the SiC crucible from surfaces of the SiC crucible in contact with the Si—C solution, and
  contacting a SiC seed crystal with a top portion of the Si—C solution so as to grow a SiC single crystal on the SiC seed crystal.

In the production method of the invention, an alloy of silicon and the metallic element M is rendered into a melt and pre-impregnated into the SiC sintered body before placing silicon and the metallic element M in the SiC crucible.

In a preferred embodiment of the production method of the invention, the metallic element M includes one or both of at least one type of a first metallic element M1 selected from the group consisting of La, Ce, Pr, Nd, Sm, Eu, Gd, Tb, Dy, Ho and Lu and at least one type of a second metallic element M2 selected from the group consisting of Ti, V, Cr, Mn, Fe, Co, Ni and Cu.

In the foregoing embodiment, the metallic element M may include both the first metallic element M1 and the second metallic element M2, and the total content of the metallic element M in the Si—C solution may be from 1 to 80 at %. Here, the content of the first metallic element M1 in the Si—C solution is preferably at least 10 at % of the total amount of silicon and M and the content of the second metallic element M2 in the Si—C solution is preferably at least 1 at % of the total amount of silicon and M.

In another preferred embodiment of the inventive production method, the metallic element M is at least one type of third metallic element M3 selected from the group consisting of Ga, Ge, Sn, Pb and Zn.

In yet another preferred embodiment, the SiC sintered body has an oxygen content of 100 ppm or less.

In still another preferred embodiment, growth of the SiC single crystal is carried out at a temperature for the Si—C solution of between 1,300 and 2,300° C.

In a further preferred embodiment, the production method is carried out with the SiC crucible held within a second crucible made of a heat-resistant carbon material.

Advantageous Effects of the Invention

Conventional SiC crucibles are dense and so silicon and carbon dissolve out locally from high-temperature areas of the crucible surface in contact with the Si—C solution, such as the bottom corners of the crucible. By contrast, in this invention, because the sintered body has a relative density of from 50 to 90%, the Si—C solution penetrates to the interior of the sintered body. Hence, with heating, the SiC of which the SiC sintered body is made serves as a source of silicon and carbon, dissolving out into the Si—C solution from the interior of the sintered body as well, and thus efficiently supplying silicon and carbon to the Si—C solution. As a result, silicon and carbon are supplied uniformly and in the proper amount from all areas of contact between the SiC crucible and the Si—C solution, enabling a high-quality SiC single crystal to be stably produced over a long time at a rapid growth rate. SiC single crystals obtained in this way are well-suited for use in SiC semiconductor devices such as power devices.

BRIEF DESCRIPTION OF THE DIAGRAMS

DESCRIPTION OF THE EMBODIMENTS

The objects, features and advantages of the invention will become more apparent from the following detailed description taken in conjunction with the appended diagrams.

The inventive method for producing a SiC single crystal is a production method that relies on a solution process in which a seed crystal is brought into contact with a Si—C solution (Si—C melt) held in a crucible (which process is referred to as top-seeded solution growth, or TSSG). This is a method for producing a SiC single crystal by placing silicon and a metallic element M that increases the solubility of carbon in a SiC crucible formed of a SiC sintered body having a relative density of from 50 to 90%, melting the silicon and the metallic element M to form a Si—C solution, dissolving in the Si—C solution, by heating of the SiC crucible, silicon and carbon originating in the SiC making up the SiC crucible from surfaces of the SiC crucible in contact with the Si—C solution, and contacting a SiC seed crystal with a top portion of the Si—C solution so as to grow a SiC single crystal on the SiC seed crystal. In this method, an alloy of silicon and the metallic element M is rendered into a melt and pre-impregnated into the SiC sintered body before placing silicon and the metallic element M that increases the solubility of carbon in the SiC crucible.

Figure 1:
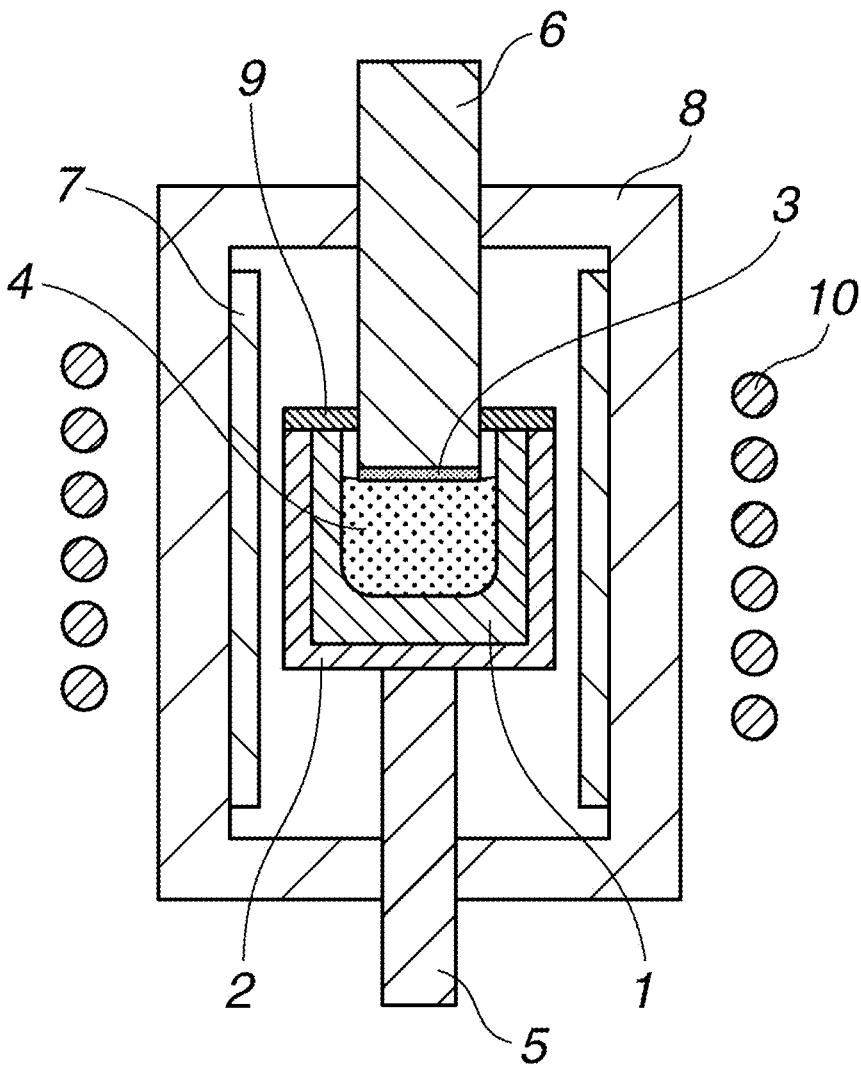
FIG. 1 is a cross-sectional view showing an example of the main portion of a SiC single crystal production apparatus that can be suitably used when growing a SiC single crystal.

FIG. 1 is a cross-sectional view showing an example of a SiC single crystal production apparatus (heating furnace) that can be suitably used when growing a SiC single crystal. Shown in this diagram are a SiC crucible 1 for holding a Si—C solution, a second crucible 2 made of a heat-resistant carbon material for holding the SiC crucible 1, a SiC single crystal 3 (seed crystal), a Si—C solution 4 held in the SiC crucible 1, a rotary shaft 5 for rotating the SiC crucible 1 and the second crucible 2 during growth of the SiC single crystal, a rotary shaft 6 for holding the SiC single crystal 3 and for rotating the SiC single crystal during crystal growth, a susceptor 7 formed of a graphite material or the like, a heat shield 8 formed of a graphite material or the like, a top cover 9 to keep the Si—C solution from evaporating, and a radio-frequency (RF) coil 10 for heating the interior of the furnace and setting the Si—C solution to a given temperature and temperature distribution. Although not shown in the diagram, the heating furnace is also equipped with an exhaust outlet and exhaust valve for evacuating the atmosphere within the furnace, and a gas inlet port and gas inlet valve for introducing gas into the furnace.

The crucible prior to heating is typically filled with silicon, although a carbon source may be added together with the silicon. When the interior of the crucible is heated, immediately after heating, the silicon and carbon making up the crucible dissolve into the silicon melt or the Si—C solution from surfaces of the SiC crucible in contact with the silicon melt or, after the carbon has dissolved, in contact with the Si—C solution. Together with silicon or silicon and carbon, it is also possible to charge the crucible prior to heating with SiC.

In the practice of the invention, the SiC sintered body has a relative density of at least 50%, and preferably at least 70%, but not more than 90%, preferably not more than 88%, and more preferably not more than 85%. As used herein, "relative density" refers to the ratio (%) of the measured density or calculated density of the SiC sintered body relative to the true density for SiC of 3.22 g/cm$^3$; that is, the value obtained by dividing the measured density or calculated density of the SiC sintered body by the true density of SiC, expressed as a percentage. The measured density is the value obtained by, for example, measuring the SiC sintered body using Archimedes' method. The calculated value is the value obtained by dividing the weight of the SiC sintered body by the volume of the SiC sintered body, as calculated from the measured dimensions of the SiC sintered body (i.e., in the case of a cylindrical crucible, the outside diameter, height, inside diameter (diameter of cavity), and height of cavity).

A SiC crucible formed of a SiC sintered body having a relative density within the above-indicated range can be obtained by, for example, dry pressing or slip casting, although the production method is not limited to these alone.

A metallic element M which increases the solubility of carbon in a Si—C solution is added to the Si—C solution 4 held in the SiC crucible 1. Adding a metallic element M that increases the solubility of carbon to the Si—C solution is advantageous because, when a SiC crucible is used, metal carbide that forms due to bonding of the added metallic element M with carbon is kept from forming. When a carbon crucible (graphite crucible) is used, the compositional ratio of silicon within the Si—C solution decreases or excessive carbon enters into the solution, lowering the Si/C compositional ratio, as a result of which the metallic element M that is added to facilitate dissolution of the carbon bonds more readily with the carbon and a metal carbide tends to form. Such a metal carbide has a high melting point and floats within the Si—C solution; if the floating metal carbide reaches the vicinity of the seed crystal surface and deposits thereon, formation of a SiC single crystal becomes impossible. By contrast, when a SiC crucible is used, excessive carbon C does not enter into the Si—C solution. As a result, the formation of metal carbide is suppressed and growth of the SiC single crystal is unlikely to be hindered.

In cases where silicon and the metallic element M which increases the solubility of carbon are placed in a SiC crucible 1 formed of a SiC sintered body having a relative density of from 50 to 90%, the pores therein being in an empty state and not filled with a Si—C solution or other melt (a solid at room temperature), such as the state of the SiC crucible prior to use, and the silicon and the metallic element M are melted to form a Si—C solution, if the metallic element M placed within the crucible is in an uncombined state or is an alloy that does not include silicon, a low-melting metal or alloy thereof preferentially penetrates into the SiC sintered body and the metallic element M and the SiC crucible react, as a result of which the composition of the Si—C solution within the SiC crucible end up deviating from the desired composition. Therefore, in this invention, before placing silicon and the metallic element M which increases the solubility of carbon in a SiC crucible, an alloy of silicon and the metallic element M, preferably an alloy having substantially the same compositional ratio as the Si—C solution when the SiC single crystal is grown, is rendered into a melt and pre-impregnated into the SiC sintered body, i.e., into pores in the SiC sintered body, thereby giving the SiC crucible 1. Specifically, the method may be one that involves placing an alloy in a SiC crucible and carrying out heat treatment within a temperature range of, for example, at least 1,300° C., and preferably at least 1,500° C., but not more than 2,300° C., and preferably not more than 2,000° C. This heat treatment is generally carried out for 1 to 10 hours. Impregnation may be carried out in a gas atmosphere such as an argon gas or other inert gas atmosphere or a nitrogen gas atmosphere, or may be carried out in a vacuum.

Examples of the metallic element M include at least one type of a first metallic element M1 selected from the group consisting of La, Ce, Pr, Nd, Sm, Eu, Gd, Tb, Dy, Ho and Lu, at least one type of a second metallic element M2 selected from the group consisting of Ti, V, Cr, Mn, Fe, Co, Ni and Cu, and at least one type of a third metallic element M3 selected from the group consisting of Ga, Ge, Sn, Pb and Zn. The total content of the metallic element M in the Si—C solution is preferably at least 1 at %, and especially at least 20 at %, but preferably not more than 80 at %, and especially not more than 50 at %, of the combined amount of Si and M. When included in the Si—C solution, the metallic element or elements M, either as the respective uncombined metals or as alloys, may be filled into the unheated crucible together with the silicon and optionally added carbon and/or SiC.

The first to third metallic elements M1, M2 and M3 may each be used alone or may be used in combination, although a combination of a metallic element M1 with a metallic element M2 is preferred. In this case, the content of the first metallic element M1 in the Si—C solution is preferably at least 10 at %, especially at least 12 at %, of the total amount of Si and M, and the content of the second metallic element M2 in the Si—C solution is preferably at least 1 at %, especially at least 10 at %, of the total amount of Si and M.

In the practice of the invention, using an apparatus such as that described above, a temperature distribution favorable for crystal growth is formed in the Si—C melt 4 by induction heating of the SiC crucible 1 using the RF coil 10, along with which silicon and carbon originating in the SiC making up the SiC crucible 1 in contact with this Si—C solution 4 are made to dissolve from the SiC crucible 1 into the Si—C solution 4. Next, a SiC seed crystal 3 is brought into contact with the Si—C solution 4 at the top of the SiC crucible 1, thereby growing a SiC single crystal on the SiC seed crystal 3. The temperature on the inside surface of the SiC crucible in contact with the Si—C solution is thus made sufficiently high to cause the silicon and carbon in the SiC making up the crucible to dissolve into the Si—C melt 4. Also, the temperature in the vicinity of the solid-liquid interface between the SiC seed crystal 3 and the Si—C solution 4 is made sufficiently high for SiC to grow as a single crystal on the SiC seed crystal 3.

In the SiC single crystal growth step, by, for example, suitably controlling the induced heating conditions from the RF coil, suitably setting the relative positions (especially in the vertical direction) of the crucible and the RF coil and suitably rotating the crucible and the SiC single crystal (seed crystal), the desired temperature distribution can be formed in the Si—C solution, thus enabling the SiC single crystal growth rate and the rate of dissolution by SiC crucible ingredients into the Si—C solution to be suitably controlled.

The temperature of the Si—C melt at the time of crystal growth is preferably at least 1,300° C., and more preferably at least 1,500° C., but preferably not more than 2,300° C., and more preferably not more than 2,000° C. A seed crystal is brought into contact with the top of the Si—C solution within the SiC crucible, thereby growing a SiC single crystal on the seed crystal. Accordingly, in at least a portion of the area of contact between the SiC crucible and the Si—C solution, a high-temperature region is created in the Si—C solution where ingredients from the SiC crucible can be made to dissolve into the Si—C solution. At the same time, in an area of contact between the Si—C solution and the seed crystal or the growth plane of the SiC single crystal that has grown on the seed crystal, a low-temperature region is created in the Si—C solution where SiC can grow as a single crystal on the seed crystal or on the SiC single crystal that has grown on the seed crystal. The Si—C solution has a temperature distribution therein that is preferably such that the temperature gradually rises from the vicinity of the seed crystal toward the vicinity of the inner surface of the SiC crucible (that is, the surface of contact with the Si—C solution), especially throughout the Si—C solution, and is preferably such that the temperature gradually rises from the top of the Si—C solution toward the bottom, especially throughout the Si—C solution. In this case, it is effective to set the temperature difference between the high-temperature region and the low-temperature region to, for example, at least 5° C., especially at least 10° C., and not more than 200° C., especially not more than 100° C. The gradient in the temperature distribution of the Si—C solution is preferably at least 1° C./cm, especially at least 5° C./cm, and preferably not more than 50° C./cm, especially not more than 30° C./cm. Growth of the SiC single crystal is generally carried out in a helium gas, argon gas or other inert gas atmosphere.

FIG. 1 shows the manner in which heating of the crucible is carried out with radio-frequency (RF) waves. However, the heating method is not limited to one that relies on RF waves. Depending on such factors as the control temperature of the Si—C solution, heating may be carried out by other methods such as resistance heating.

Figure 2:
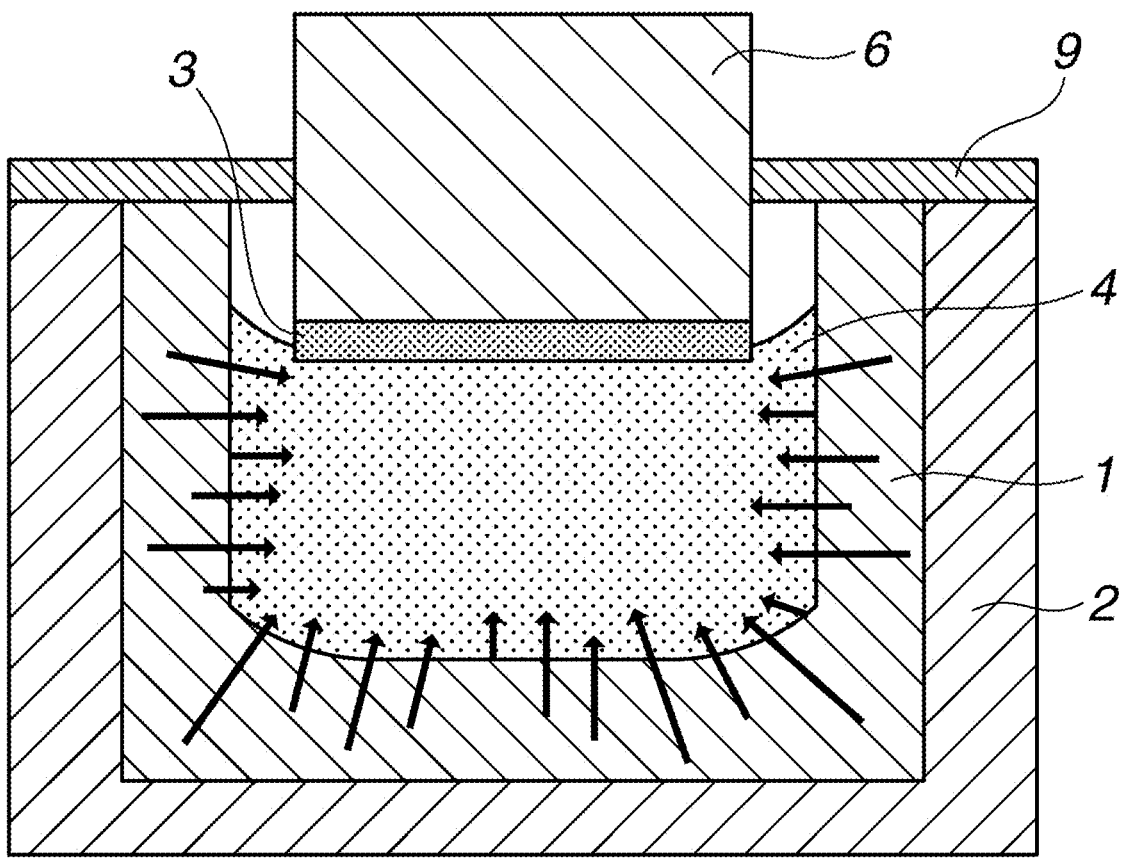
FIG. 2 is a schematic diagram showing the manner in which, when a SiC single crystal is grown using a SiC crucible formed of a SiC sintered body having a relative density of 50 to 90%, silicon and carbon dissolve into a Si—C solution from inside the SiC crucible.

FIG. 2 is a diagram which schematically illustrates the manner in which silicon and carbon dissolve from the SiC crucible into the Si—C solution when a SiC crystal is grown using a SiC crucible formed of a SiC sintered body having a relative density of 50 to 90%. By creating in the Si—C solution 4 a temperature distribution which is suitable for crystal growth, silicon and carbon that originate from the SiC making up the SiC crucible 1 dissolve out into the Si—C solution 4 from SiC crucible 1 surfaces (especially high-temperature regions) in contact with the Si—C solution 4. The silicon and carbon that have dissolved out become fresh silicon and carbon in the Si—C solution 4 and serve as ingredient sources for the single crystal that grows on the SiC seed crystal 3. Also shown in this diagram are a second crucible 2, a rotary shaft 6 and a top cover 9, which correspond to the like features in FIG. 1.

In such an environment where the dissolution of silicon and carbon from the SiC crucible 1 into the Si—C solution 4 occurs, the problem of SiC polycrystal precipitation onto crucible surfaces in contact with the Si—C solution does not arise. This is because the conditions under which the SiC making up the SiC crucible 1 dissolves out into the Si—C solution as silicon and carbon do not allow for silicon and carbon to precipitate out as SiC. In other words, by using a crucible made of SiC as the receptacle for the Si—C solution, the precipitation of SiC polycrystals at crucible surfaces in contact with the Si—C solution is suppressed.

Furthermore, by using a SiC crucible formed of a SiC sintered body having a relative density of from 50 to 90%, the Si—C solution not only comes into contact with the surface of the SiC crucible, it also penetrates into the interior (pores) of the sintered body. As indicated by the arrows in FIG. 2, SiC is supplied by efficiently dissolving out also from the interior of the SiC crucible, thus increasing the crystal growth rate and also suppressing SiC polycrystals. As a result, a state within the solution like that shown in FIG. 2 appears to be achieved. At a relative density for the SiC sintered body making up the SiC crucible of less than 50%, when the SiC crucible melts, the SiC disintegrates into SiC particles, giving rise to a conspicuous state in which SiC particles float within the Si—C solution; at a relative density greater than 90%, penetration of the SiC solution into the interior (pores) of the sintered body substantially does not arise and the effective dissolution of SiC in the SiC solution cannot be achieved.

Figure 3:
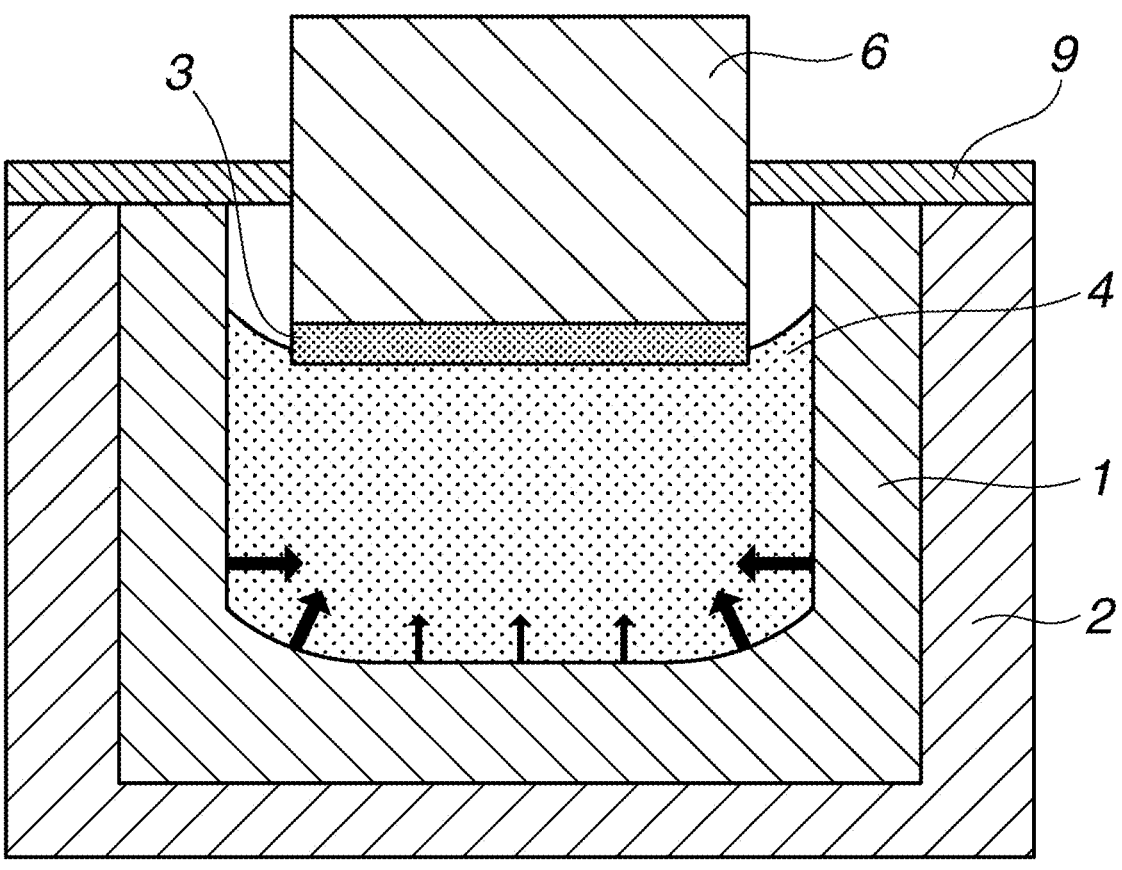
FIG. 3 is a schematic diagram showing the manner in which, when a SiC single crystal is grown using a conventional dense SiC crucible, silicon and carbon dissolve into a Si—C solution from inside the SiC crucible.

By contrast, FIG. 3 is a diagram that schematically illustrates the manner in which silicon and carbon dissolve from the SiC crucible into the Si—C solution when a SiC crystal is grown using a conventional dense SiC crucible (e.g., a SiC crucible formed of a SiC sintered body having a relative density of more than 90%). In this case, because the Si—C solution 4 only comes into contact with the surface of the SiC crucible 1 and the dissolution of silicon and carbon into the Si—C solution 4 is inadequate, the supply of SiC from the SiC crucible (dissolution into the Si—C solution) is not uniform at areas of contact between the SiC crucible and the Si—C solution; instead, SiC dissolution proceeds preferentially at the high-temperature areas of the SiC crucible, especially the bottom corners as indicated by the arrows in FIG. 3, making the growth of a SiC single crystal over a long time difficult. Also shown in this diagram are a second crucible 2, a SiC seed crystal 3, a rotary shaft 6 and a top cover 9, which correspond to the like features in FIG. 1.

Additionally, in the SiC crucible 1 of this invention, the SiC sintered body (specifically, pores in the SiC sintered body) is pre-impregnated with, as a melt, an alloy of the silicon and the metallic element M, preferably an alloy having substantially the same compositional ratio as the Si—C solution used when growing the SiC single crystal. Hence, when the silicon and the metallic element M are melted to form a Si—C solution, the metallic element M does not react preferentially with the SiC crucible and so the composition of the Si—C solution within the SiC crucible is maintained at the desired composition.

Silicon and carbon continuously dissolve out from the SiC crucible. Generally, however, when single crystal growth is carried out while rotating the crucible and the seed crystal, it is possible to make the composition within the Si—C solution homogeneous by a stirring effect.

In FIG. 1, the SiC crucible 1 is placed inside a second crucible 2 made of a heat-resistant carbon material. In the present invention which uses a SiC crucible formed of a SiC sintered body having a relative density of from 50 to 90%, the Si—C solution sometimes passes through the pores in the SiC sintered body and leaks out onto the outside surface of the SiC crucible. For this reason, it is preferable to place the SiC crucible within a second crucible. The second crucible 2 in this case is preferably formed of a material having a degree of density such that the Si—C solution does not leak out. Using a second crucible also has the advantage of facilitating control of the temperature distribution within the Si—C solution.

Oxygen is generally present as an impurity in the SiC sintered body making up the SiC crucible. The oxygen contained within the SiC sintered body forms an oxide (SiO). Because the boiling point of SiO is about 1,880° C., when the temperature of the Si—C solution is at or above this boiling point and, with dissolution of the SiC, the SiO gasifies within the Si—C solution and reaches the interface of the growing SiC single crystal with the Si—C solution (solid-liquid interface), there is a chance that it will be taken up at the crystal growth surface and generate voids within the SiC single crystal. Also, when oxygen contained within the SiC sintered body, with dissolution of the SiC, dissolves into the Si—C solution and the temperature of the Si—C solution is below the boiling point of SiO, in cases where the oxygen reacts with silicon in the Si—C solution to form SiO and this SiO reaches the interface of the growing SiC single crystal with the Si—C solution (solid-liquid interface), there is a chance that it will be taken up at the crystal growth surface and generate voids within the SiC single crystal. It is thus preferable for the SiC sintered body to have an oxygen content of not more than 100 ppm.

In the solution process, a SiC single crystal is furnished as the seed crystal. The seed crystal used for this purpose may be, for example, a SiC single crystal obtained by a sublimation process or a SiC single crystal obtained by a solution process (meaning here, in a broad sense, solution processes which include, for example, the aforementioned traveling solvent method, slow cooling technique, vapor liquid solid method and top-seeded solution growth method).

In the SiC single crystal production method of the invention, owing to the use of a SiC crucible obtained by impregnating a SiC sintered body with an alloy of silicon and a metallic element M that increases the solubility of carbon, with heating of the crucible, the SiC which makes up the SiC sintered body and serves as a source of silicon and carbon dissolves out into the Si—C solution from the interior as well of the sintered body, so that silicon and carbon are efficiently supplied to the Si—C solution. As a result, silicon and carbon are supplied uniformly and in the proper amount from all areas of contact between the SiC crucible and the Si—C solution, enabling a high-quality SiC single crystal free of SiC polycrystals-deposition to be stably produced over a long time (The lower limit is, for example, 1 hour or more, especially 5 hours or more. The upper limit is not particularly limited, but for example, 15 hours) at a rapid growth rate (The lower limit is, for example, 10 μm/hr or more, especially 100 μm/hr or more. The upper limit is not particularly limited, but for example, 400 μm/hr.).

EXAMPLES

Examples and Comparative Examples are given below to more concretely illustrate the invention, although the invention is not limited by these Examples.

Example 1

A SiC single crystal was grown in an apparatus like that shown in FIG. 1 using a SiC sintered body crucible having an outside diameter of 60 mm, a height of 70 mm, an inside diameter (cavity diameter) of 50 mm, a cavity height of 60 mm, a relative density of 80% and an oxygen content of 15 ppm as the SiC crucible 1. The SiC crucible 1 was charged with a Pr—Fe—Si alloy (composition: Pr, 16 at %; Fe, 20 at %; Si, 64 at %) in an amount corresponding to the total pore volume in the SiC sintered body (equivalent to 20 vol % of SiC sintered body) and 10 hours of heat treatment was carried out at 1,500° C. in an argon atmosphere, thereby impregnating the alloy into the pores of the SiC sintered body. Next, Pr, Fe and Si were each charged as uncombined metals in a composition of 16 at % Pr, 20 at % Fe, 64 at % Si; based on density calculations, the amount was adjusted to give a Si—C solution depth of 27 mm. A 21 mm (dia)×10.4 mm single crystal (polytype: 4H) attached to a 19 mm diameter graphite seed shaft in such a way that the growth plane becomes the c-plane was used as the seed crystal 3. Crystal growth was carried for 10 hours at 2,000° C. in an argon atmosphere by rotating the SiC crucible 1 and the seed shaft (rotary shaft 6) at respective speeds of 20 rpm in opposing directions (one direction of rotation being clockwise and the other being counterclockwise) and pulling the ingot at a rate of 0.1 mm/hr.

Figure 4:
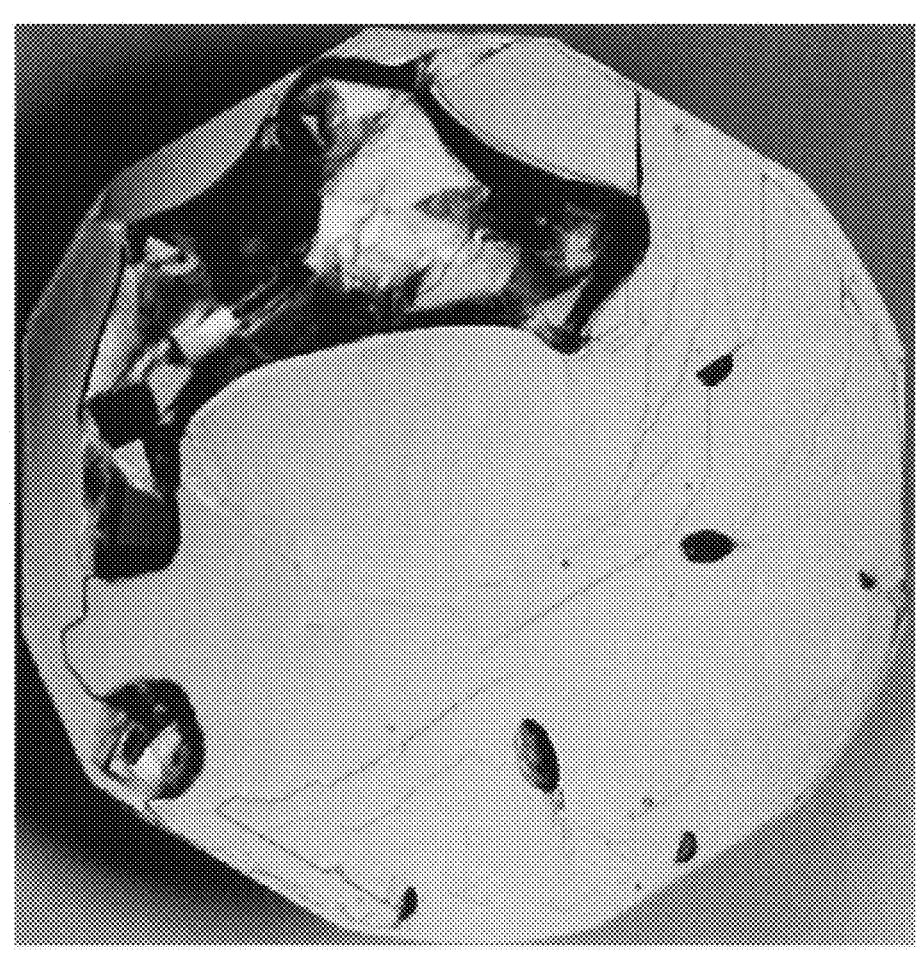
FIG. 4 is a photograph of the growth plane of the SiC single crystal obtained in Example 1.

Evaluation of the resulting crystal showed that, as can be seen in the photograph of the SiC single crystal growth plane shown in FIG. 4, a flat single crystal free of defects and polycsystals-deposition was obtained. The growth thickness after 10 hours was 2,550 μm, indicating a growth rate of 255 μm/hr.

Comparative Example 1

A SiC single crystal was grown in an apparatus like that shown in FIG. 1 using a SiC sintered body crucible (a sintered body having an outside diameter of 60 mm, a height of 70 mm, an inside diameter (cavity diameter) of 50 mm, a cavity height of 60 mm, a relative density of 45% and an oxygen content of 15 ppm). The SiC crucible was charged, without impregnating an alloy into pores of the SiC sintered body, with Pr, Fe and Si, each as uncombined metals, in a composition of 16 at % Pr, 20 at % Fe, 64 at % Si; based on density calculations, the amount was adjusted to a Si—C solution depth of 27 mm. A 21 mm (dia)×10.4 mm single crystal (polytype: 4H) attached to a 19 mm diameter graphite seed shaft in such a way that the growth plane becomes the c-plane was used as the seed crystal 3. Crystal growth was carried for 10 hours at 2,000° C. in an argon atmosphere by rotating the SiC crucible and the seed shaft (rotary shaft 6) at respective speeds of 20 rpm in opposing directions (one direction of rotation being clockwise and the other being counterclockwise) and pulling the ingot at a rate of 0.1 mm/hr.

Figure 5:
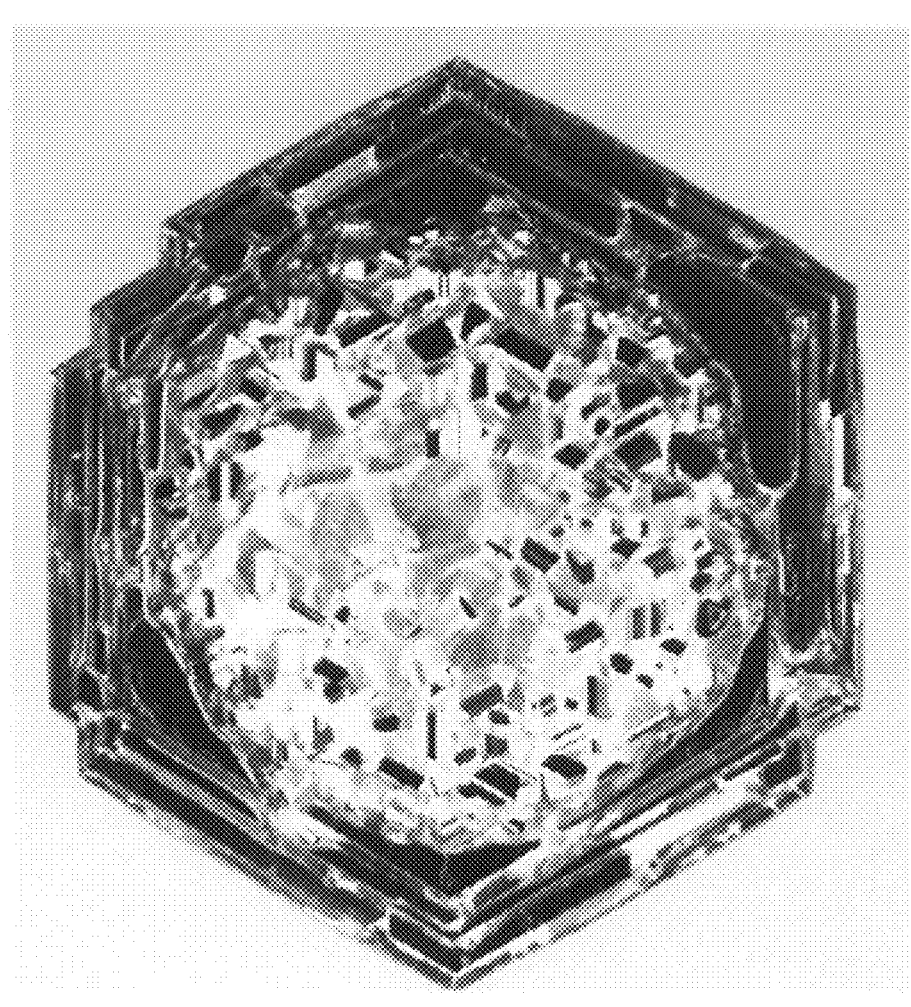
FIG. 5 is a photograph of the growth plane of the SiC crystal obtained in Comparative Example 1.

Evaluation of the resulting crystal showed that, as can be seen in the photograph of the SiC single crystal growth plane shown in FIG. 5, SiC polycrystals deposited over the entire single crystal. The growth thickness after 10 hours was 1,500 μm, indicating a growth rate of 150 μm/hr.

The melting points of the elements charged as starting materials in Example 1 and Comparative Example 1 are 935° C. for Pr, 1,538° C. for Fe and 1,414° C. for Si, the melting point of Pr being much lower than that of the other elements. After the SiC single crystal was grown, the alloy that solidified from the Si—C solution remaining at the bottom of the SiC crucible was removed from the crucible and subjected to compositional analysis. In Example 1, the composition was Pr, 15.8 at %, Fe, 20.2 at %, Si, 64.0 at %, which was substantially the same composition as that of the charged materials. By contrast, in Comparative Example 1, the composition was Pr, 8.5 at %, Fe, 23.0 at %, Si, 68.5 at %, indicating a low level of Pr and confirming that the composition differed from that of the charged materials.

The causes for the deposition of SiC polycrystals and the lower growth rate in Comparative Example 1, in spite of the use of silicon and metallic elements M (Pr, Fe, Si) having the same composition as in Example 1, are thought to be as follows. Because the metals (Pr, Fe, Si) were charged in an uncombined form, the low-melting Pr dissolved first and penetrated into the SiC crucible. Hence, Pr, which has a high SiC solubility, caused a large amount of SiC to dissolve. The supply of a large amount of dissolved SiC to the Si—C solution now having a dearth of Pr and a composition that deviates from the desired composition caused the SiC to reach a saturated state, resulting in the formation of SiC polycrystals which floated on the liquid surface and deposited on the single crystal.

Japanese Patent Application Nos. 2021-128833 and 2022-116851 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for producing a SiC single crystal, comprising the following order of:

providing a SiC crucible formed of a SiC sintered body having a relative density of from 50 to 90% and pores, wherein an alloy has been impregnated into the pores of the SiC sintered body in advance, the alloy including first silicon and a first metallic element M that increases a solubility of carbon, placing second silicon and a second metallic element M in the SiC crucible, heating the SiC crucible to melt the second silicon and the second metallic element M, into which the first silicon and carbon originating from SiC in the SiC crucible are supplied, thereby forming a Si—C solution, and contacting a SiC seed crystal with a top portion of the Si—C solution so as to grow the SiC single crystal on the SiC seed crystal, wherein the first metallic element M comprises one or both of at least one type of a metallic element M1 selected from the group consisting of La, Ce, Pr, Nd, Sm, Eu, Gd, Tb, Dy, Ho and Lu, and wherein the second metallic element M comprises at least one type of another metallic element M2 selected from the group consisting of Ti, V, Cr, Mn, Co, Ni and Cu.

2. The production method of claim 1, wherein each of the first metallic element M and the second metallic element M comprises both the metallic element M1 and said another metallic element M2, and a total content of the first metallic element M and the second metallic element M in the Si—C solution is from 1 to 80 at %.

3. The production method of claim 2, wherein a content of the metallic element M1 in the Si—C solution is at least 10 at % of a total amount of silicon and M, and a content of said another metallic element M2 in the Si—C solution is at least 1 at % of the total amount of silicon and M.

4. The production method of claim 1, wherein the SiC sintered body has an oxygen content of 100 ppm or less.

5. The production method of claim 1, wherein growth of the SiC single crystal is carried out at a temperature for the Si—C solution of between 1,300 and 2,300° C.

6. The production method of claim 1, wherein the method is carried out with the SiC crucible held within a second crucible made of a heat-resistant carbon material.

7. The production method of claim 1, wherein a growth rate of the SiC single crystal is 10 μm/hr or more.

8. The production method of claim 1, wherein a growth rate of the SiC single crystal is 100 μm/hr or more.

* * * * *